(12) United States Patent
Geoffroy et al.

(10) Patent No.: US 10,828,697 B2
(45) Date of Patent: Nov. 10, 2020

(54) ASSEMBLY METHOD BY SILVER SINTERING WITHOUT PRESSURE

(71) Applicant: SAFRAN ELECTRONICS & DEFENSE, Boulogne Billancourt (FR)

(72) Inventors: Thomas Geoffroy, Boulogne Billancourt (FR); Jean-Christophe Riou, Boulogne Billancourt (FR); Eric Bailly, Boulogne Billancourt (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 74 days.

(21) Appl. No.: 15/760,056

(22) PCT Filed: Sep. 15, 2016

(86) PCT No.: PCT/EP2016/071866
§ 371 (c)(1),
(2) Date: Mar. 14, 2018

(87) PCT Pub. No.: WO2017/046266
PCT Pub. Date: Mar. 23, 2017

(65) Prior Publication Data
US 2019/0047044 A1    Feb. 14, 2019

(30) Foreign Application Priority Data

Sep. 15, 2015 (FR) ..................... 15 58625

(51) Int. Cl.
*B22F 7/06* (2006.01)
*B22F 1/00* (2006.01)
(Continued)

(52) U.S. Cl.
CPC ............ *B22F 1/0059* (2013.01); *B22F 7/064* (2013.01); *H01G 9/0029* (2013.01); *H01G 9/15* (2013.01);
(Continued)

(58) Field of Classification Search
CPC ...... B22F 3/1017; B22F 3/1021; B22F 7/008; B22F 7/02; B22F 7/04; B22F 7/06;
(Continued)

(56) References Cited

U.S. PATENT DOCUMENTS

2003/0108664 A1  6/2003  Kodas et al.
2009/0162557 A1  6/2009  Lu et al.
(Continued)

FOREIGN PATENT DOCUMENTS

EP   2278593 A1   1/2011
EP   2998048 A1 * 3/2016  ............ B22F 1/0055

OTHER PUBLICATIONS

Zhang et al., "Nanoscale Silver Sintering for High-Temperature Packaging of Semiconductor Devices," Materials Processing and Manufacturing Division, Global Symposium Surfaces and Interfaces in Nonostructured Materials and Tredsin LIGA, Miniaturization and Nanoscale Materials, Jan. 1, 2004, pp. 129-135.
(Continued)

*Primary Examiner* — Vanessa T. Luk
(74) *Attorney, Agent, or Firm* — Muncy, Geissler, Olds & Lowe, P.C.

(57) ABSTRACT

An assembly method for assembling a first element to a second element by pressureless metal sintering, the method having a preparation step during which a sintering material is arranged at a bond interface of the elements, a pre-sintering step during which the assembly is heated for a first duration that is longer than five minutes at a first temperature that is higher than 200° C. and strictly lower than or equal to the temperature for activating diffusion at the grain boundaries, and a densification step during which the assembly is heated for a second duration at a second temperature that is higher than or equal to the temperature for activating diffusion at the grain boundaries.

12 Claims, 3 Drawing Sheets

(51) Int. Cl.
*H05K 3/34* (2006.01)
*H05K 3/32* (2006.01)
*H01G 9/00* (2006.01)
*H01G 9/15* (2006.01)
*H05K 1/09* (2006.01)

(52) U.S. Cl.
CPC ............. *H05K 3/32* (2013.01); *H05K 3/3494* (2013.01); *H05K 1/097* (2013.01); *H05K 3/3442* (2013.01); *H05K 2203/1131* (2013.01)

(58) Field of Classification Search
CPC .. B22F 7/062; B22F 7/064; B22F 7/08; B22F 2007/042; B22F 2007/045; B22F 2007/047; B22F 2007/068; B22F 2304/058; B22F 2304/10; B23K 35/0244; B23K 35/025; B23K 35/3006; B23K 35/3013; B23K 35/302
See application file for complete search history.

(56) References Cited

U.S. PATENT DOCUMENTS

| | | | |
|---|---|---|---|
| 2011/0084369 A1 | 4/2011 | Eder et al. | |
| 2011/0186340 A1 | 8/2011 | Kuramoto et al. | |
| 2012/0055707 A1 | 3/2012 | Schafer et al. | |
| 2013/0068373 A1* | 3/2013 | Schafer | B23K 35/3618 156/89.16 |
| 2014/0063757 A1* | 3/2014 | Takagi | H01L 23/10 361/752 |
| 2015/0257280 A1* | 9/2015 | Ciliox | H01L 24/75 228/122.1 |

OTHER PUBLICATIONS

Kwan et al., "Low Temperature Sintering Process for Deposition of Nano-Structured Metal for Nano IC Packaging," Electronics Packaging Technology, 2003 5$^{th}$ Conference, Dec. 10-12, 2003, pp. 551-556.

* cited by examiner

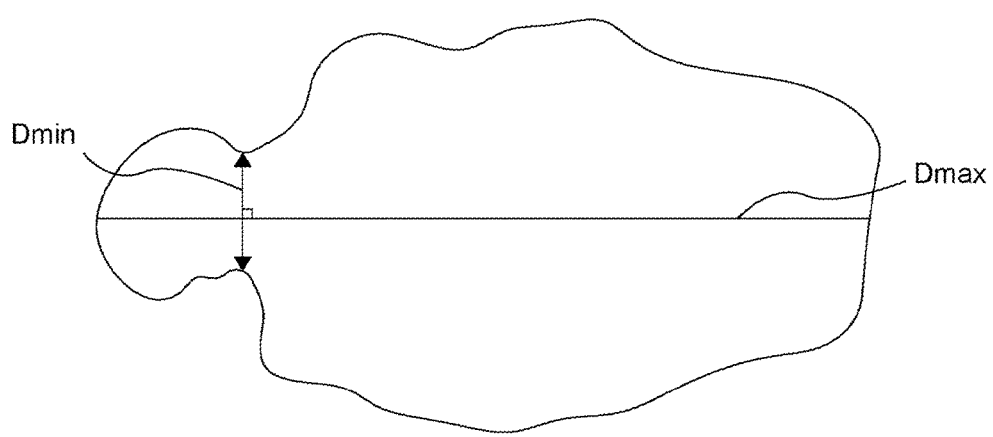

ASSEMBLY METHOD BY SILVER SINTERING WITHOUT PRESSURE

FIELD OF THE INVENTION

The present invention relates to the field of assembling parts and more particularly of assembling electronic components.

BACKGROUND OF THE INVENTION

It is known to assemble an electronic component, such as a multilayer ceramic capacitor, by soldering, in particular using lead, on a silicon substrate. That assembly technique uses temperatures that are lower than the melting temperatures of the elements to be assembled. Such temperatures make it possible to reduce the impact of heat on the elements to be assembled, such as for example oxidation or damaging their mechanical properties. Such soldering methods lend themselves well to automated production methods.

When an electronic assembly is subjected to temperature variations of large amplitude (of the order of at least 150° C., for example, −65° C./+250° C.), the assembly is subjected to large variations of mechanical stresses due to differences in thermal expansion between the materials used. When that phenomenon occurs cyclically, the assembly is exposed to fatigue wear.

Among solders commonly used in the field of electronics, solders using lead alloys are the best at withstanding temperature cycles of large amplitude. However, lead is highly toxic for humans and for the environment and its use is now prohibited.

As an alternative to lead-containing solders, it is known to assemble components using pressure-sintered metal connections that withstand temperature cycles of large amplitude. In that assembly method, a metal powder is placed between two elements to be assembled and the unit thus formed is put under pressure and then heated to a moderate temperature of the order of 240° C.

Assembly by sintering makes it possible to form bonds between the assembled elements, which bonds have melting points that are much higher than those of the alloys used conventionally for soldering. Generally, the higher the melting point of the bond, the better its mechanical properties, in particular its fatigue resistance.

However, during assembly by sintering, open spaces may form between the grains constituting the sintered metal bond. Those open spaces are gaps in the material having dimensions of micrometer order. If the porosity (ratio of the volume of the open spaces divided by the total volume of a porous medium) of a bond made by sintering is excessive, its ability to withstand temperature cycles of large amplitude will be low and failures will occur after a limited number of cycles.

During pressure sintering, the pressure applied while heating the powder makes it possible to densify the sintered metal bond, i.e. to reduce the number and the size of the gaps in the bond, which therefore provides satisfactory fatigue resistance. Densification is generally accompanied by a reduction in the size of the assembly. However, the need to put the assembly under pressure makes it impossible to use pressure sintering methods with delicate and fragile components, such as for example resistors or thermistors formed from metal oxides, which can be brittle. In addition, pressure sintering is difficult to use in industry because applying an identical pressure simultaneously on all of the components of an electronic circuit is difficult, especially when the components are not all of the same height. Pressure sintering performed component by component would be lengthy and costly.

It has been envisaged to assemble with sintered metal but without using pressure, in particular by using sintering pastes. However, in the absence of pressure, the bonds obtained with that assembly method are of low density, porous, and provide low fatigue resistance—in particular when they are subjected to temperature cycles of large amplitude. It has been observed that a porous microstructure promotes stress concentrations. Unfortunately, cracks propagate all the more rapidly in a medium with high stresses.

OBJECT OF THE INVENTION

An object of the invention is to provide a method of assembling electronic components that improves the ability of the assembly to withstand temperature cycles of large amplitude.

SUMMARY OF THE INVENTION

To this end, the invention provides an assembly method for assembling a first element to a second element by pressureless metal sintering, the method comprising the following steps:

a) a preparation step during which a sintering material comprising metal particles is arranged at a bond interface of the first element and of the second element, the sintering material comprising at least 80% metal particles having a greatest dimension lying in the range 0.5 micrometers ($\mu$m) to 50 $\mu$m;

b) a pre-sintering step during which the assembly constituted by the first element, the second element, and the sintering material is heated for a first duration that is longer than five minutes at a first temperature that is higher than 200° C. and strictly lower than the temperature for activating diffusion at the grain boundaries;

c) a densification step during which the assembly is heated for a second duration at a second temperature that is higher than or equal to the temperature for activating diffusion at the grain boundaries.

An assembly is thus obtained with a densified bond but without application of a force on the parts, thus making it possible to assemble delicate and/or fragile parts together. The assembly obtained in this way provides satisfactory resistance to thermomechanical stresses. Compared to pressure sintering, such a method makes industrial implementation easier and quicker.

The temperature for activating diffusion at the grain boundaries may be determined by means of a dilatometric study, as described in the detailed description of the invention.

Advantageously, the sintering material comprises at least 80% metal particles having a greatest dimension that lies in the range 0.7 $\mu$m to 5 $\mu$m. It is particularly easy to obtain assemblies that are hermetic and resistant to thermomechanical fatigue when the sintering material comprises at least 80% flake-type metal particles. Preferably, the sintering material comprises at least 80% metal particles having a form factor that is less than 0.3.

Advantageously, the metal particles are particles of silver, copper, or gold.

This makes it possible to take advantage of the specific characteristics of each metal (corrosion, conductivity, cost . . . ).

In a particular implementation, the method further comprises a relaxation step subsequent to the densification step and during which the assembly is stoved for a third duration at a temperature lying in the range $0.3\ T_f$ to $0.5\ T_f$, where $T_f$ is the melting temperature of the sintering material in degrees Kelvin.

This step makes it possible to relieve the internal stresses by reducing the stress concentrations of the assembly and thus improve its fatigue strength.

Other characteristics and advantages of the invention appear on reading the following description of particular, non-limiting embodiments of the invention.

BRIEF DESCRIPTION OF THE DRAWINGS

Reference is made to the accompanying drawings, in which:

FIG. 5 is a diagrammatic view of a metal particle.

DETAILED DESCRIPTION OF THE INVENTION

As a preamble to the following description of an implementation of the method of the invention, there is described an example of how to determine the temperature for activating diffusion at the grain boundaries Tt for a given sintering material, in this example a sintering paste 51 comprising metal particles.

After being dried in order to ensure any solvents it contains have been removed, a sample of the sintering material is introduced into a dilatometer, in this implementation in the form of a pellet having a height of 2 millimeters (mm), and a diameter of 6 mm. Starting from ambient temperature, the sample is heated along a temperature ramp, in this example, 30° C. per minute. During heating of the sample, variation in its height—in this case shrinkage—is measured. The term "shrinkage" refers to contraction of the powder sample during heating. A curve is then established plotting the shrink rate (obtained from the time derivative of the measured shrinkage value) as a function of temperature.

The temperature for activating diffusion at the grain boundaries Tt is defined as being the lowest temperature at which a shrink rate of at least 20 μm/min is observed for a sample with a height of 2 mm.

Exceeding the temperature for activating diffusion at the grain boundaries Tt during the densification step makes it possible to ensure that diffusion of the metal from the metal particles at the grain boundaries is activated. That makes it possible to improve reliability of the assembly.

For a silver-based sintering material, the temperature Tt lies in the range 340° C. to 360° C. It should be observed that the temperature Tt may vary as a function of the sizes and shapes of the metal particles. For a gold or copper-based sintering material, the temperature Tt is significantly higher than 340° C.

Figure 1:
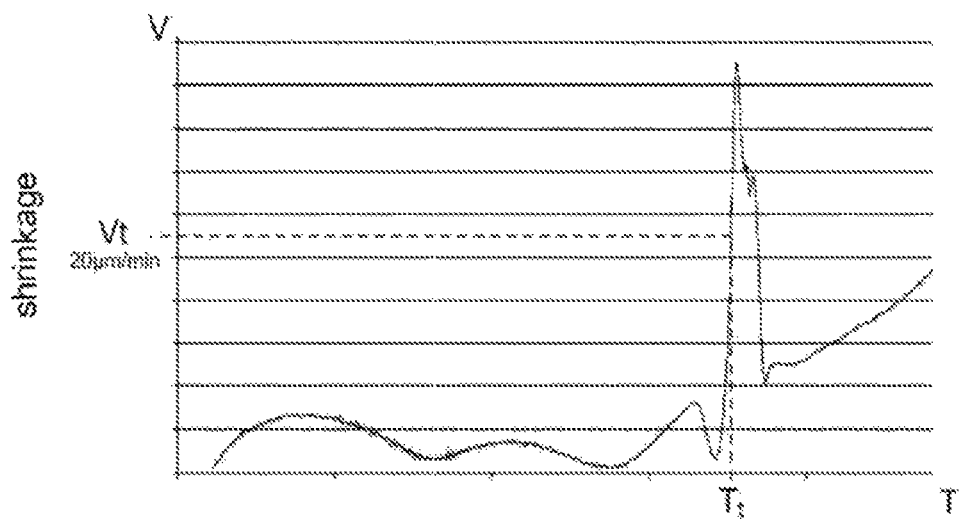
FIG. 1 is a graph showing variation in the shrink rate of a sintering material as a function of the temperature.
Figure 2:
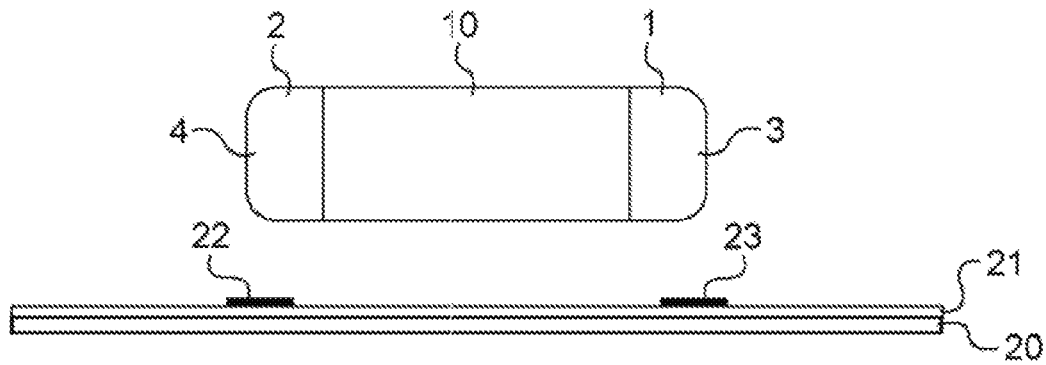
FIG. 2 is a diagram in cross-section showing a first step of the method of the invention.

With reference to FIG. 2, the method of assembly is described with application to assembling a first element, in this example a multilayer ceramic capacitor (MLCC), given overall reference 10, to a second element, in this example a rigid alumina substrate 20 having the shape of a plate and provided with a metallization layer of silver 21.

The capacitor 10 is of substantially rectangular shape and includes two peripheral surfaces 1 and 2 each provided with a metallization layer 3 and 4 of silver.

Along with the zones 22 and 23 corresponding to the projections of the surfaces 1 and 2 of the capacitor 10 onto the substrate 20, the surfaces 1 and 2 of the capacitor 10 define two bond interfaces 30 and 31 for bonding the capacitor 10 and the substrate 20.

In a preparation first step 40, blocks 50.1 and 50.2 of sintering paste 51 are placed respectively at the bond interfaces 30 and 31 between the capacitor 10 and the substrate 20. The blocks 50.1 and 50.2 cover at least the interfaces 30, 31 and have thickness lying in the range 1 μm to 1 mm. There is thus obtained an assembly 52 constituted by the stack comprising the capacitor 10, the blocks 50.1 and 50.2 of sintering paste 51, and the substrate 20.

In the meaning of the present application, a metal sintering paste is constituted by a metal powder and by one or more liquid or paste solvents. A metal sintering paste is said to be micrometric when the particles that it contains have a greatest dimension that is not greater than one micrometer. A metal sintering paste is said to be nanometric when the particles that it contains have a greatest dimension that is not greater than one nanometer. In this implementation, the sintering paste 51 comprises micrometric particles of silver.

In the following steps of the method of the invention, no pressure above that caused by the weight of the capacitor 10 is exerted on the blocks 50.1, 50.2 of sintering paste 51. In any event, the method of assembly by pressureless sintering of the invention implies that any pressure that might be applied on the sintering material by an element (e.g. a press) other than the component parts of the manufactured assembly should be less than 0.5 Newtons (N) per square millimeter.

In the pre-sintering second step 41, the assembly 52 is heated for a first duration D1 of one hour at a first temperature T1 lying in the range 200° C. to 300° C., i.e. a temperature that is strictly lower than the temperature for activating diffusion at the grain boundaries Tt and higher than 180° C. During the pre-sintering step 41, the temperature T1 may vary so long as it remains lower than the temperature Tt. During this step, surface self-diffusion predominates over other methods of self-diffusion. Prior to step 41, it is possible to heat the assembly 52 progressively from ambient temperature to the temperature T1. It is also possible to heat the assembly 52 almost instantaneously by inserting it into an enclosure that has been preheated to the first temperature T1. The purpose of the pre-sintering step 41 is to perform preliminary consolidation of the assembly 52 by creating cohesion between the capacitor 10, the sintering paste 51, and the substrate 20. The step 41 also makes it possible to solidify the assembly before the densification step. Specifically, the densification produces sudden shrinkage that can cause cracking of the bonds and decohesion between the metallization and the bonds. Adding the pre-sintering step 41 thus considerably improves reliability of the electronics assembled in this way.

A densification third step 42 is then performed during which the assembly 52 is heated at a second temperature T2 lying in the range 450° C. and 550° C. for a second duration D2 of forty-five minutes. During this step, grain boundary self-diffusion and/or volume self-diffusion are predominant over surface self-diffusion. During the densification step 42, the temperature T2 may vary so long as it remains higher than the temperature Tt and lower than the melting temperature of the sintering material, in this implementation the melting temperature of silver is 961.8° C. The transition between the step 41 and the step 42 may be performed by heating the assembly 52 progressively from the temperature T1 to the temperature T2. It is also possible to cause the assembly 52 to pass almost instantaneously from the first temperature T1 to the second temperature T2 by inserting it into an enclosure that has been preheated to the second temperature T2.

The pre-sintering step 41 consolidates the assembly 52, which enables it to withstand the shrinkage that takes place during the densification step 42.

Advantageously, the temperature profile of the step 41 is selected so as to obtain an increase in the volume of the grains and/or the pores lying in the range 0% to 100%. In other words, the temperature profile of the step 41 is selected so that the final volume (at the end of the step 41) of the grains does not exceed twice their initial volume. The same applies to the pores for which the final volume must not exceed twice their initial volume. Such a pre-sintering step 41 serves to increase the efficiency of the densification step 42.

In a relaxation fourth step 43, the assembly is stoved at a third temperature T3 of about 300° C. for a third duration of twelve hours.

This relaxation fourth step 43 is optional and aims to relax the thermomechanical internal stresses created during preceding steps. It should be observed that the assembly method of the invention gives satisfactory results even in the absence of the relaxation step 43.

In the meaning of the present application, stoving is an operation during which an object is maintained at a constant setpoint temperature, i.e. having variation of no more than ten percent from the value of the setpoint temperature.

Figure 3:
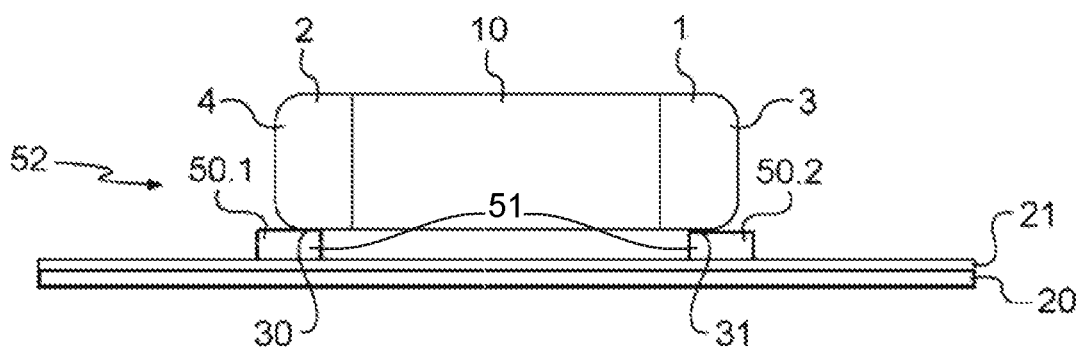
FIG. 3 is a view identical to FIG. 2 showing a second step of the method of the invention.
Figure 4:
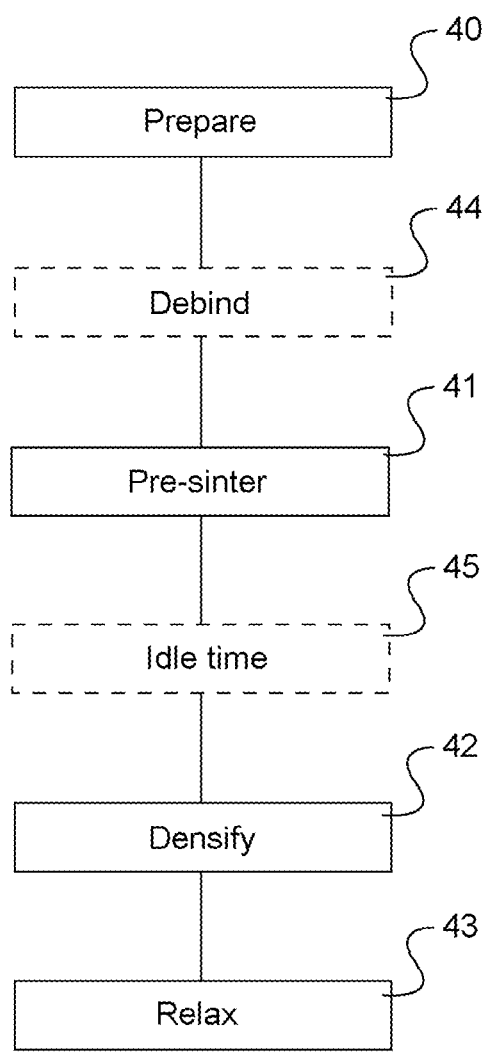
FIG. 4 is a flow chart showing the various steps of the method of the invention.

In a second implementation, a debinding intermediate step 44 is added between the assembly first step 40 and the pre-sintering second step 41 (shown in dashed lines in FIG. 3). During this debinding step 44, the assembly 52 is stoved at a fourth temperature T4 lying in the range 50° C. to 120° C. for a duration lying in the range 5 minutes (min) to 45 min. The debinding step 44 aims to purge the sintering paste 51 of any solvents it contains by evaporation, sublimation, and/or combustion.

The debinding step 44 is optional and the assembly method of the invention gives satisfactory results even in the absence of a debinding step 44.

In a third implementation, it is possible to add an idle-time step 45 situated between the pre-sintering second step 41 and the densification third step 42. During this idle-time step 45, the assembly 52 is returned to ambient temperature. This makes it possible, among other things, to inspect the assembly 52 at the end of the pre-sintering step without having to take any particular precautions for handling.

The idle-time step 45 is optional and the assembly method of the invention gives satisfactory results even in the absence of an idle-time step 45.

The assembly 52 obtained by the method of the invention includes a sintered metal bond that presents a microstructure in which porosity has been totally, or almost totally, eliminated. In contrast, a bond made by conventional pressureless sintering presents numerous gaps.

Where necessary, the mechanical performance of the assembly can be improved by preliminary or intermediate interface surfacing operations aiming to obtain particular surface states (rough or smooth) or to apply a coating (metallization or other).

Among micrometric sintering powders, the invention preferably applies to powders comprising at least 80% metal particles having a greatest dimension lying in the range 0.5 µm to 50 µm, and very preferably, to powders comprising at least 80% metal particles having a greatest dimension lying in the range 0.7 µm to 5 µm. The inventors have observed that the use of these selections of sintering powders, combined with the method of the invention, makes it possible to obtain sintered bonds having porosity that is particularly low relative to prior art methods. Even lower porosity of the sintered bond is obtained by selecting, within the above-described ranges of preferred sizes, powders comprising predominantly flake-type metal particles. A particle is referred to as a flake when its form factor f is less than 0.5. The form factor f corresponds to the inverse of the ratio of the greatest dimension of a particle Dmax divided by the smallest dimension Dmin of the particle measured orthogonally to Dmax (cf. FIG. 5).

Thus, the use of powders comprising at least 80% metal particles having a greatest dimension Dmax lying in the range 0.5 µm to 50 µm and having a form factor f that is less than 0.5 makes it possible to obtain sintered bonds of very low porosity. A selection, from among these powders, retaining those comprising at least 80% metal particles having a greatest dimension lying in the range 0.5 µm to 50 µm and having a form factor f that is less than 0.3 makes it possible to obtain sintered bonds of very low porosity. Further selection from among these powders in order to use those comprising at least 80% metal particles having a greatest dimension Dmax lying in the range 0.7 µm to 5 µm and having a form factor f that is less than 0.3 makes it possible to further reduce the porosity of the sintered bonds.

Surprisingly, the inventors have observed that, whereas a compact pile of micrometric and/or nanometric spherical particles gives a porosity in the vicinity of 26%, and a pile of flake type micrometric particles gives porosity in the vicinity of 45%, the ratio R: "average size of the metal particles over average size of the pores" obtained after pre-sintering a bond having micrometric particles of flake type is greater than that obtained after sintering of a bond having micrometric and/or nanometric particles that are spherical. However, after sintering, the porosity of a bond decreases correspondingly for increasing the ratio R before sintering. Thus, selecting flake type particles in a sintering powder comprising at least 80% metal particles having a greatest dimension lying in the range 0.5 µm to 50 µm leads to sintered bonds that are more hermetic and more resistant to thermomechanical fatigue than bonds obtained by means of sintering powder comprising nanometric metal particles, without requiring the use of high sintering temperatures. Since micrometric powders are less costly than nanometric powders and less dangerous for the user, the invention significantly improves economy of the method and the conditions under which it is carried out.

Preferred ranges for temperature and duration for the steps of the method of the invention for a sintering material comprising gold metal particles and for a sintering material comprising silver metal particles are given in the table below:

|  | Debinding Step 44 | Pre-sintering Step 41 | Densification Step 42 | Relaxation Step 43 |
| --- | --- | --- | --- | --- |
| Silver | 50° C. to 100° C. | 200° C. to 300° C. | 450° C. to 550° C. | 220° C. to 340° C. |

-continued

|  | Debinding Step 44 | Pre-sintering Step 41 | Densification Step 42 | Relaxation Step 43 |
|---|---|---|---|---|
| Gold | 50° C. to 100° C. | 300° C. to 400° C. | 480° C. to 700° C. | 260° C. to 400° C. |
| Duration (whatever the type of metal comprising the powder particles) | 5 min to 45 min | Longer than 5 min | No limits | 30 min to 30 h |

Naturally, the invention is not limited to the implementations described but encompasses any variant coming within the ambit of the invention as defined by the claims.
In particular:
- although in this disclosure the sample of sintering material is subjected to a dilatometric test in the form of a pellet with a height of 2 mm and a diameter of 6 mm to which heat is applied along a temperature ramp of 30° C. per minute, the invention applies to other forms of sample, to other temperature ramps, and also to other methods of determining a curve plotting the shrink rate as a function of temperature. However, for a sample height h that is other than 2 mm, the shrink rate Vt corresponding to the temperature for activating diffusion at the grain boundaries needs to be adapted according to the following mathematical formula: Vt(in µm/min)=10*h(in mm).
- although in this disclosure the second element is a plane rigid substrate made of alumina, the invention also applies to a second element of a different nature such as for example other types of ceramics such as aluminum nitride, silicon nitride, or beryllium oxide, or a flexible substrate made of polymer material, or a concave or convex substrate of any shape;
- although in this disclosure the second element is a plane ceramic substrate, the invention also applies to a second element of a different nature, e.g. made of silicon or of stainless steel and covered with an electrically-insulating material;
- although in this disclosure the first element is a multilayer ceramic capacitor, the invention also applies to a first element of a different nature, such as, for example, an electrolytic capacitor, a resistor, a thermistor, a silicon component a capacitive or piezoresistive pressure sensor, a semi-conductor device having a forbidden band that is greater than 1.5 electron volts (eV) at 25° C. such as silicon carbide or gallium nitride, among others;
- although in this disclosure the capacitor is of substantially rectangular shape, the invention also applies to electronic components having different shapes such as for example a cylindrical or other shape;
- although in this disclosure the substrate is provided with a metallization layer of silver for sintering with a sintering material comprising silver, the invention also applies to a substrate coated in metallization of a metal that is different to the metal of the sintering material;
- although in this disclosure the assembly has two bond interfaces, the invention also applies to an assembly having a different number of bond interfaces such as for example a single bond interface, or more than two;
- although in this disclosure the sintering material is a sintering paste comprising silver particles, the invention also applies to other types of sintering materials such as for example, sintering powders. The assembly method of the invention also applies to sintering materials comprising particles of different metals such as for example, particles of gold, copper, or a mixture thereof;
- although in this disclosure the sintering material is a sintering paste comprising pure metal particles, the invention also applies to other types of sintering materials such as for example, sintering powders constituted of metal alloys, metal solid solutions, or mixtures of different powders;
- although in this disclosure the relaxation step is performed for a duration of twelve hours, the method of the invention may include relaxation steps of duration that may vary in the range thirty minutes and thirty hours;
- although in this disclosure the densification step has a second duration of forty-five minutes, the invention also applies to any densification step, whatever its duration;
- although in this disclosure the sintering material comprises micrometric metal particles, the invention also applies to other types of material comprising metal particles having a greatest dimension that is less than fifty micrometers, such as for example sintering materials comprising nanometric metal particles;
- although in this disclosure the first temperature applied during the pre-sintering step lies in the range 200° C. to 300° C., the invention also applies to a pre-sintering step during which the assembly is heated at different temperatures, so long as the temperatures remain strictly lower than the temperature for activating diffusion at the grain boundaries. This temperature should not be lower than 200° C.;
- although in this disclosure the second temperature applied during the densification step lies in the range 450° C. to 550° C., the invention also applies to a densification step during which the assembly is heated at a different temperature, so long as the temperature remains higher than the temperature of transition between the surface diffusion sintering domain and the grain boundary sintering domain, while remaining below the melting temperature of the sintering material; and
- although in this disclosure the third temperature applied during the relaxation step is about 300° C., the invention also applies to a relaxation step during which the assembly is heated at a different temperature, so long as the temperature remains in the range $0.3\ T_f$ to $0.5\ T_f$, where $T_f$ is the melting temperature of the metal or of the alloy of the sintering material in degrees Kelvin.

The invention claimed is:
1. An assembly method for assembling a first element to a second element by pressureless metal sintering, the method comprising the following steps:
 a) a preparation step, during which a sintering material comprising predominantly metal particles is arranged at a bond interface of the first element and the second element, the sintering material having a greatest dimension lying in the range of 0.5 µm to about 50 µm;
 b) a pre-sintering step, during which the assembly constituted by the first element, the second element, and the sintering material is heated for a first duration that is longer than five minutes at a first temperature that is lower than a temperature for activating diffusion at grain boundaries;
 c) a densification step, during which the assembly is heated for a second duration at a second temperature that is higher than or equal to the temperature for activating diffusion at the grain boundaries, wherein the sintering material comprises at least about 80% flake-type metal particles having a form factor (f) that is less than 0.3,
wherein the sintering material is a powder.

2. The method according to claim 1, wherein the sintering material comprises predominantly metal particles has a greatest dimension lying in the range of 0.7 µm to 5 µm.

3. The method according to claim 1, wherein the metal particles are silver particles and the first temperature lies in the range of 200° C. to 300° C.

4. The method according to claim 1, wherein the metal particles are silver particles and the second temperature lies in the range of 450° C. to 550° C.

5. The method according to claim 1, wherein the metal particles are gold particles and the first temperature lies in the range of 300° C. to 400° C.

6. The method according to claim 1, wherein the metal particles are gold particles and the second temperature lies in the range of 480° C. to 700° C.

7. The method according to claim 1, wherein the first temperature is varied during the first duration.

8. The method according to claim 1, wherein the second temperature is varied during the second duration.

9. The method according to claim 1, further comprising a relaxation step, subsequent to the densification step, during which the assembly is stoved at a temperature lying in the range of 0.3 Tf to 0.5 Tf, where Tf is the melting temperature of the sintering material in Kelvin, for a third duration.

10. The method according to claim 9, wherein the third duration lies in the range of thirty minutes to thirty hours.

11. The method according to claim 1, comprising an idle-time step situated between the pre-sintering step and the densification step, during which the assembly is returned to the ambient temperature.

12. The method according to claim 1, comprising a debinding step that is performed between the preparation step and the pre-sintering step, during which the assembly is stoved at a temperature lying in the range of 50° C. to 100° C.

* * * * *